(12) United States Patent
Yeh et al.

(10) Patent No.: US 9,412,751 B2
(45) Date of Patent: Aug. 9, 2016

(54) ELECTRONIC DEVICE

(71) Applicant: Realtek Semiconductor Corp., HsinChu (TW)

(72) Inventors: Ta-Hsun Yeh, Hsinchu (TW); Tay-Her Tsaur, Tai-Nan (TW); Cheng-Cheng Yen, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 13/969,611

(22) Filed: Aug. 19, 2013

(65) Prior Publication Data

US 2014/0054801 A1    Feb. 27, 2014

(30) Foreign Application Priority Data

Aug. 22, 2012    (TW) .............................. 101130491 A

(51) Int. Cl.
| | | |
|---|---|---|
| *H01L 27/115* | (2006.01) | |
| *H01L 23/48* | (2006.01) | |
| *H01L 23/00* | (2006.01) | |
| *H01L 27/02* | (2006.01) | |

(52) U.S. Cl.
CPC .......... *H01L 27/11548* (2013.01); *H01L 23/48* (2013.01); *H01L 24/05* (2013.01); *H01L 24/06* (2013.01); *H01L 27/11575* (2013.01); *H01L 27/0296* (2013.01); *H01L 2224/0556* (2013.01); *H01L 2224/05553* (2013.01); *H01L 2224/05554* (2013.01); *H01L 2224/06135* (2013.01); *H01L 2224/06155* (2013.01); *H01L 2224/06163* (2013.01); *H01L 2224/06165* (2013.01)

(58) Field of Classification Search
CPC .................... H01L 27/11548; H01L 27/11575

USPC ......... 257/288, 690, 691, 692, 734, 773, 779, 257/784, 786, E29.111, E29.112, E29.113, 257/E29.116, E29.126, E29.127, E23.01, 257/E23.012, E23.079, E23.175

See application file for complete search history.

(56) References Cited

U.S. PATENT DOCUMENTS

| | | | | |
|---|---|---|---|---|
| 5,698,873 | A * | 12/1997 | Colwell ............ | H01L 27/11807 257/204 |
| 6,700,143 | B2 * | 3/2004 | Tuan et al. ..................... | 257/288 |
| 7,170,114 | B2 * | 1/2007 | Shimanuki .................... | 257/203 |
| 2002/0140107 | A1 * | 10/2002 | Kato et al. ..................... | 257/777 |
| 2002/0195697 | A1 * | 12/2002 | Mess et al. .................... | 257/686 |
| 2008/0079461 | A1 * | 4/2008 | Lin ................... | H01L 21/76816 326/80 |
| 2008/0128755 | A1 * | 6/2008 | Fukamizu et al. ............. | 257/203 |
| 2009/0179234 | A1 * | 7/2009 | Maher et al. .................. | 257/256 |
| 2011/0073950 | A1 * | 3/2011 | Tsutsumi et al. ............. | 257/358 |
| 2011/0285304 | A1 * | 11/2011 | Yinn et al. ..................... | 315/210 |
| 2012/0132997 | A1 * | 5/2012 | Tokita ............................ | 257/368 |
| 2013/0093052 | A1 * | 4/2013 | Ma et al. ....................... | 257/533 |

FOREIGN PATENT DOCUMENTS

| | | |
|---|---|---|
| TW | 201010043 | 3/2010 |
| TW | 201119006 | 6/2011 |

* cited by examiner

*Primary Examiner* — Eduardo A Rodela

(74) *Attorney, Agent, or Firm* — Winston Hsu; Scott Margo

(57) ABSTRACT

An electronic device includes a core circuit and multiple pad units. The core circuit includes multiple core MOS and the multiple pad units are respectively electrically connected to the core circuit. Each pad unit includes at least one pad MOS. A core gate in each core MOS and a pad gate in each pad MOS extend along the same direction or extend parallel with each other.

9 Claims, 7 Drawing Sheets

ELECTRONIC DEVICE

BACKGROUND OF THE INVENTION

1. Field of the Invention

The present invention generally relates to an electronic device. In particular, the present invention relates to an electronic device with a core circuit which is electrically connected to a pad unit. A core gate in the core metal oxide semiconductor and a pad gate in the pad metal oxide semiconductor all have the same extension direction or are in a direction parallel to each other.

2. Description of the Prior Art

General speaking, semiconductor processes are used to manufacture chips with integrated circuits. Such chips are equipped with pad units for use as input/output (I/O), to have communicating functions such as to receive input signals and to carry output signals, and possibly to control or drive signals, i.e., the chips communicate with other circuits through the pads.

In addition, the integrated circuit (IC) chips may suffer from electrostatic discharge (ESD) during the manufacturing process or the system applications. The electrostatic discharge signals may penetrate the chips through the pads, which can seriously damage the interior chip circuits. Thus, the pad circuits of the chips should also be electrostatic discharge-proof.

However, with regard to the advanced processes below the 40-nanometer (nm), the problem of device dismatch makes the core circuits of the integrated circuit and the components of the pad units face many challenges.

SUMMARY OF THE INVENTION

As a result, one of the purposes of the present invention is to propose an electronic device (e.g., integrated circuits), to arrange the metal oxide semiconductors both in the core circuits and in the pad units along the same direction, in order to overcome the conventional technical issue of device dismatch, and further to propose different arrangements of the pad units to optimize the area occupancy, and to increase the convenience and diversity of connection to the core circuits or to the bonding wires.

The present invention in a first aspect proposes an electronic device. The electronic device of the present invention includes a core circuit and a plurality of pad units. The core circuit includes a plurality of core metal oxide semiconductors (core MOS). Multiple pad units are respectively electrically connected to the core circuit. Each pad unit includes at least one pad metal-oxide-semiconductor (pad MOS). A core gate in each core metal oxide semiconductor and a pad gate in each pad metal oxide semiconductor all have the same extension direction.

The present invention in a second aspect proposes another electronic device. The electronic device of the present invention includes a core circuit and a plurality of pad units. The core circuit includes a plurality of core metal oxide semiconductors (core MOS). Multiple pad units are respectively electrically connected to the core circuit. Each pad unit includes at least one pad metal-oxide-semiconductor (pad MOS). A core gate in each core metal oxide semiconductor and a pad gate in each pad metal oxide semiconductor all have extension directions parallel to each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 illustrates an embodiment, in which a single row of the pad units in the pad unit group of the electronic device of the present invention are arranged in the vicinity of four sides of the core circuits.

FIG. 2 illustrates a core gate and a pad gate have the same extension direction.

FIG. 3 illustrates a core gate and a pad gate have extension directions parallel to each other.

FIG. 4, FIG. 5, FIG. 6 and FIG. 7 illustrate that the pad regions in the pad units of the same row are staggered.

DETAILED DESCRIPTION

The electronic devices according to the present invention all of gates in its metal oxide semiconductors, either in the core circuit or in the pad unit, have the same extending direction or extend along directions parallel to one another. Further, the pad units may be arranged at the four sides of the core circuit in variously different ways.

Figure 1:
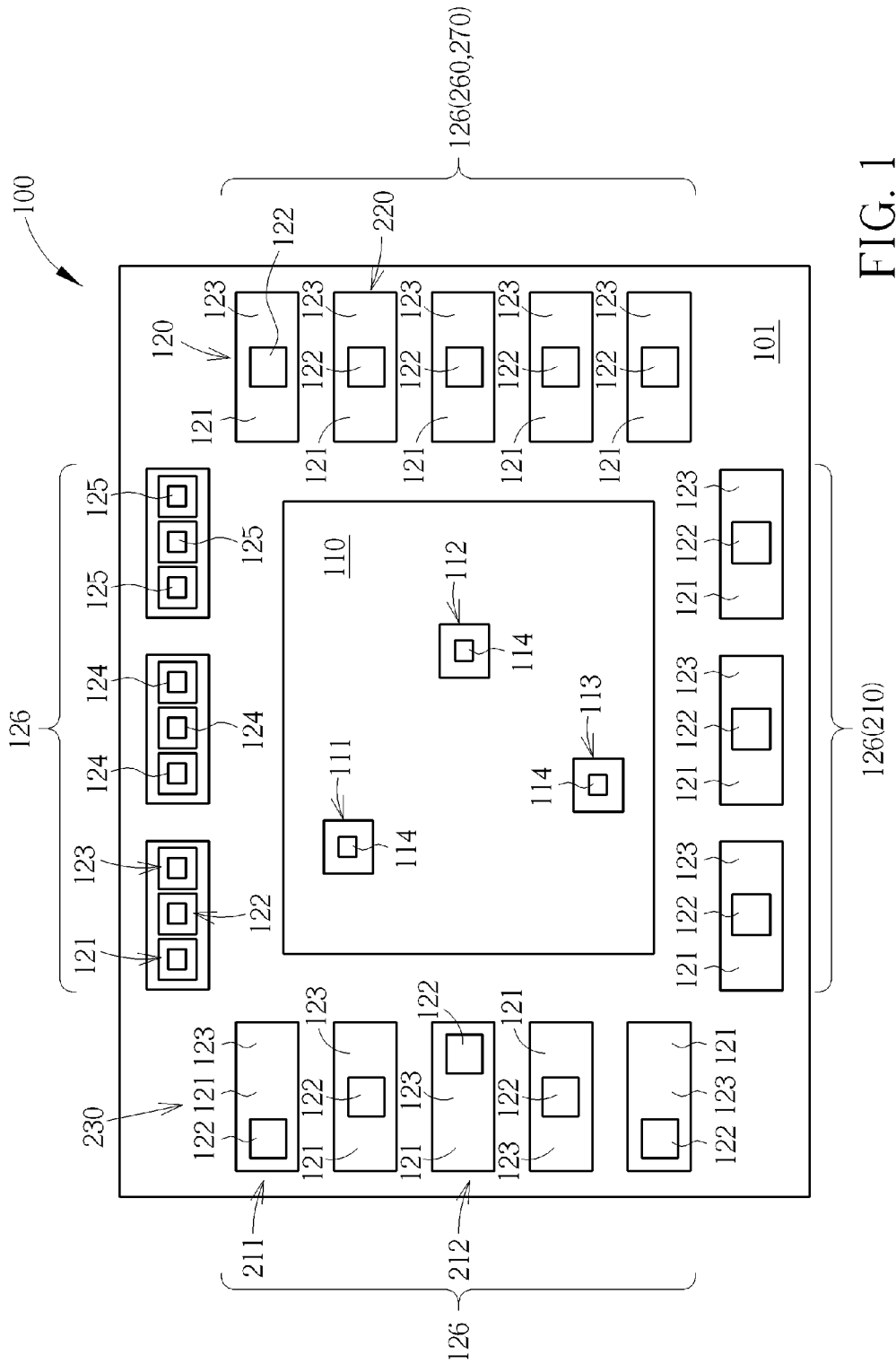
FIG. 1 to FIG. 7 illustrate various embodiments of the electronic device of the present invention.

FIG. 1 to FIG. 7 illustrate various embodiments of the electronic device of the present invention. FIG. 1 illustrates an embodiment, in which a single row of the pad units in the pad unit group of the electronic device of the present invention are arranged in the vicinity of four sides of the core circuits. Please refer to FIG. 1, the electronic device 100 of the present invention is disposed on a chip 101 and includes at least the core circuits 110 and a plurality of pad units 120. The core circuits 110 are disposed in a region of the chip 101 to perform the primary functions. In the core circuit 110 there are a plurality of core metal oxide semiconductor, such as core metal oxide semiconductors 111/112/113 for example.

Multiple pad units 120 are disposed in the peripheral region of the core circuits 110, in charge of controlling, driving, or electrically connected to the chip, or to prevent the core circuits 110 from the damage of the electrostatic discharge. Multiple pad units 120 are respectively electrically connected to the core circuits. For example, the pad unit 120 may include an N-type metal-oxide-semiconductor region 121, a pad region 122 and a P-type metal oxide semiconductor region 123. In one embodiment, the pad region 122 is a pad of circuit under pad (CUP). Therefore, there may be a metal oxide semiconductor underneath. So the pad metal-oxide-semiconductor 124 may be disposed in at least one of the N-type metal-oxide-semiconductor region 121, the pad region 122 and the P-type metal-oxide-semiconductor region 123. Preferably, all of the N-type metal-oxide-semiconductor region 121, the pad region 122 and the P-type metal-oxide-semiconductor region 123 have the pad 124.

Figure 2:
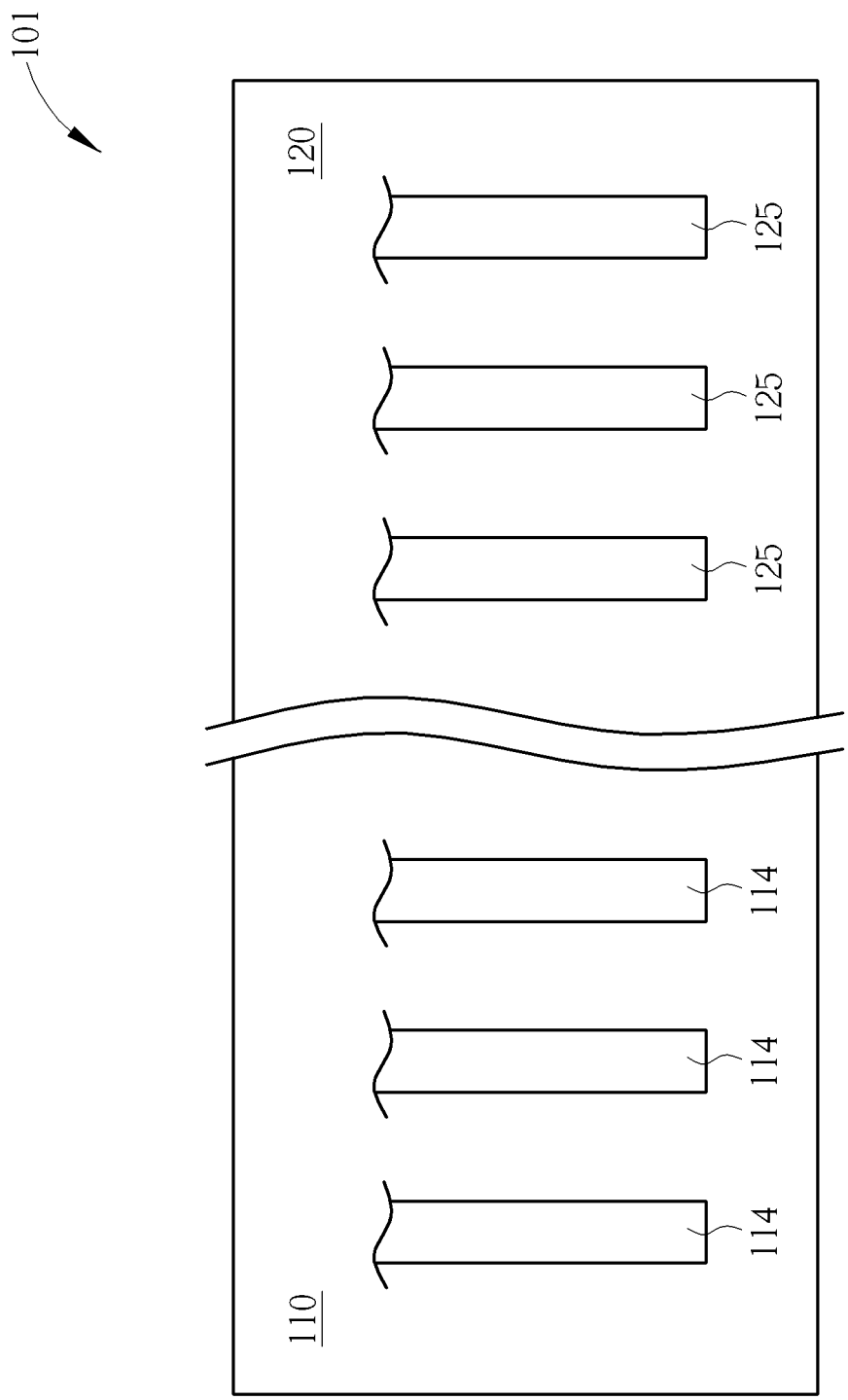
Figure 3:
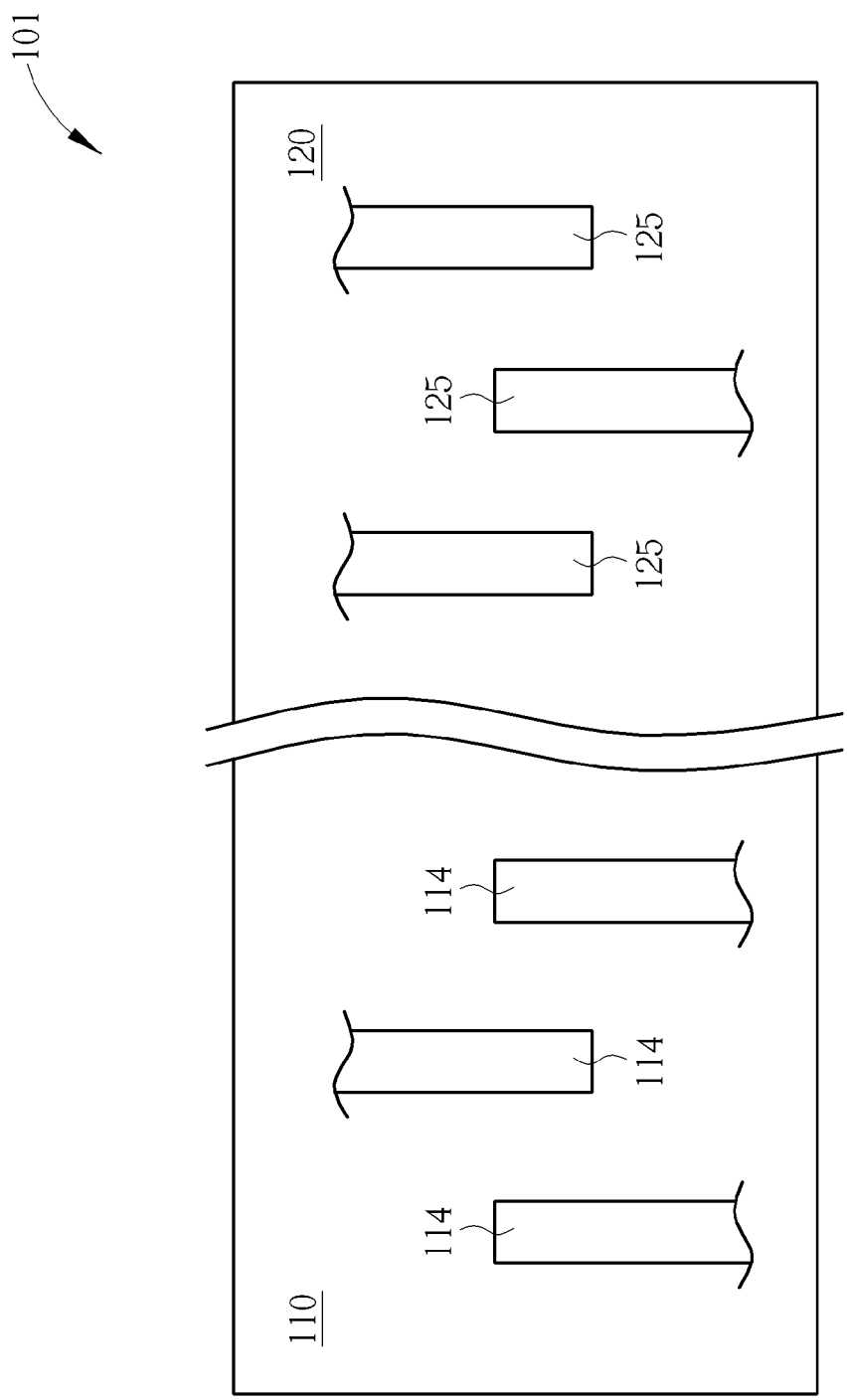

On one hand, each core metal-oxide-semiconductor 111/112/113 has a core gate 114 within. On the other hand, since in the pad unit 120 there may be an N-type metal-oxide-semiconductor region 121, a pad region 122 and a P-type metal-oxide semiconductor region 123 and a pad metal-oxide-semiconductor 124 may be in the N-type metal-oxide-semiconductor region 121, the pad region 122 and the P-type metal-oxide semiconductor region 123 so there must be a pad gate 125 in a pad unit 120. Please refer to FIG. 2, all the core gates 114 and the pad gates 125 extend in the same direction. Or please refer to FIG. 3, all core gates 114 and pad gates 125 extend in directions parallel to one another. In FIG. 2 and FIG. 3, all of the core gates 114 and pad gates 125 extend in the perpendicular direction or parallel to this direction and the corresponding source and drain are disposed at two sides (in the parallel direction).

Figure 4:
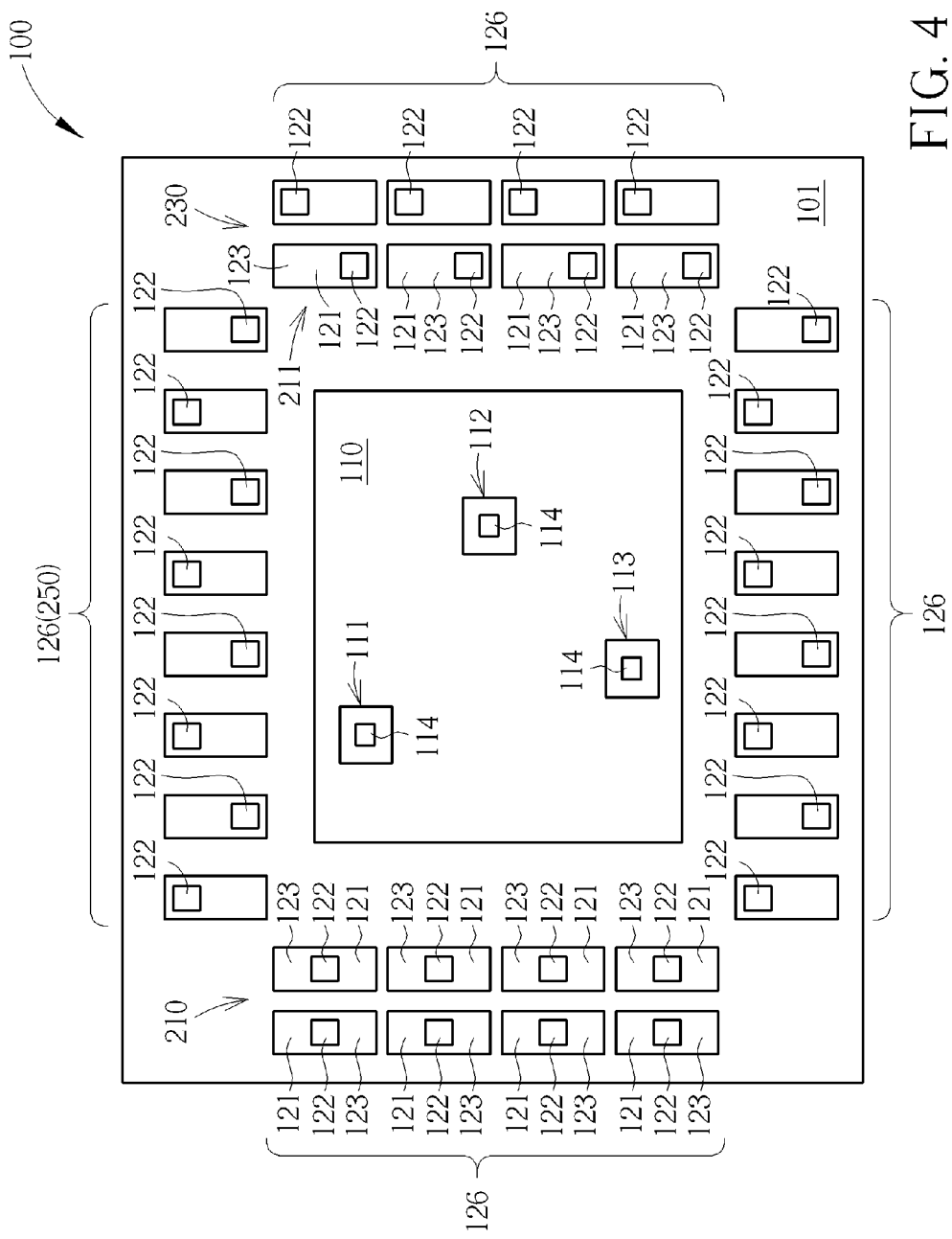

In one embodiment of the present invention, as shown in FIG. 1, multiple pad units 120 may be divided into multiple pad unit groups 126, and each pad unit group 126 is arranged along one side of the edge regions adjacent to the core circuit 110. In another embodiment of the present invention, as shown in FIG. 4 or in FIG. 5, multiple pad units 120 may also be divided into multiple pad unit groups 126, arranged along the adjacent sides of the core circuits 110, and multiple pad units 120 in a pad unit group 126 disposed at one of the four sides of the core circuit 110 may be pad units 120 in a single row, as shown in FIG. 1, or pad units 120 of at least two rows, as shown in FIG. 4, FIG. 5, FIG. 6 or FIG. 7. In other words, in multiple pad unit groups 126, there may be one pad unit group 126 with at least two rows of the pad units 120.

The pad unit 120 in the pad unit groups 126 of the present invention may be variously arranged in the vicinity of the four sides of the core circuits 110 in accordance with different needs. The followings are provided to show some possible arrangements of multiple pad units 120 and pad unit groups 126 arranged in the vicinity of the four sides of the core circuit 110.

First, in one embodiment of the present invention, as shown in FIG. 1 or in FIG. 4, the pad region 122 in all of the pad units 120 in a certain pad unit group 126 is sandwiched between the N-type metal-oxide-semiconductor region 121 and the P-type metal-oxide-semiconductor region 123 (arrangement 210). Or, the N-type metal-oxide semiconductor region 121 in the pad unit 120 is sandwiched between the pad region 122 and the P-type metal-oxide semiconductor region 123 (arrangement 211). Alternatively, the P-type metal oxide semiconductor region 123 in the pad unit 120 is sandwiched between the N-type metal-oxide-semiconductor region 121 and the pad 122 (arrangement 212).

Figure 6:
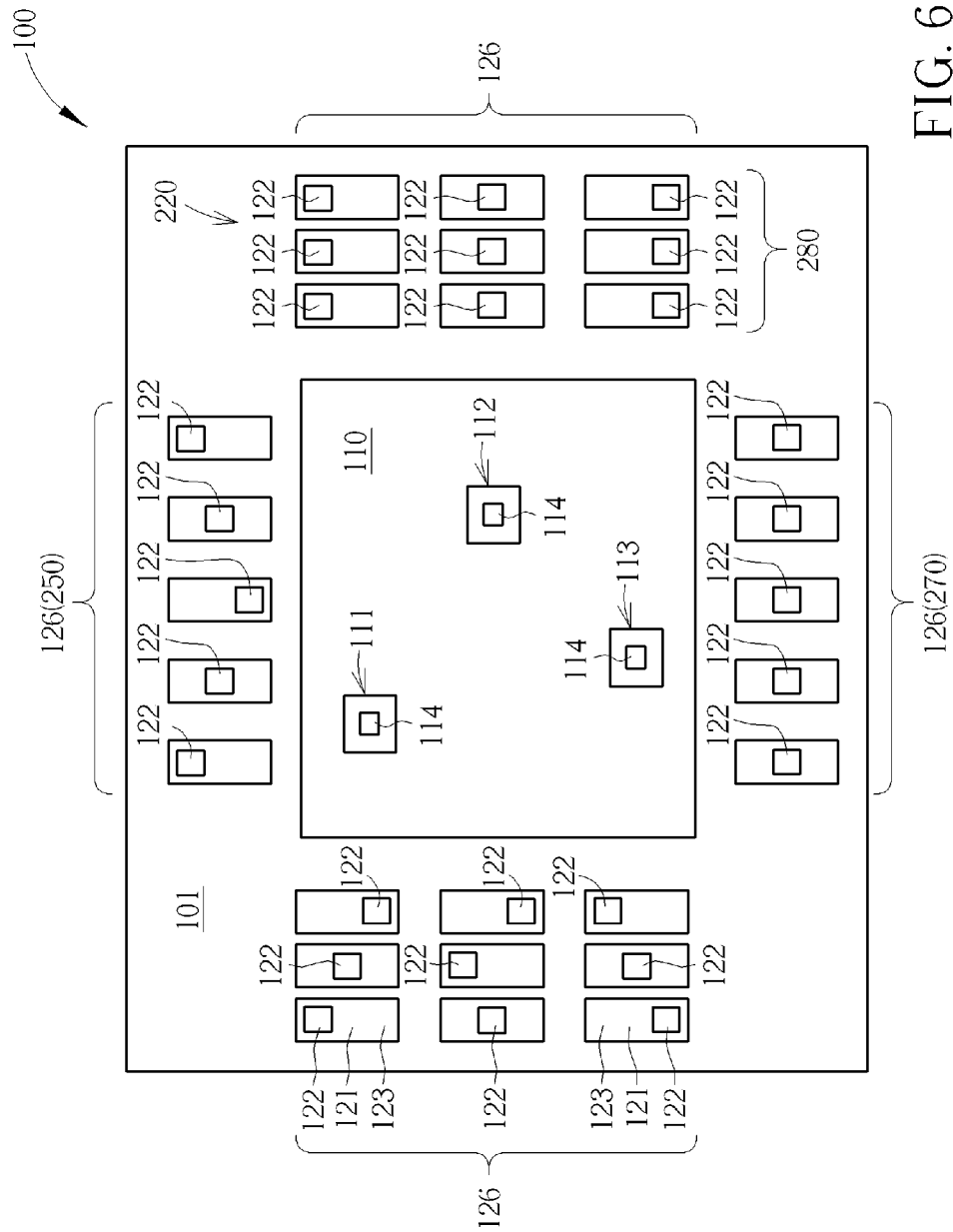

Secondly, in another embodiment of the present invention, as shown in FIG. 1 or in FIG. 6, the pad region 122 in the pad unit 120 is sandwiched between the pad regions 122 of adjacent pad units 120 (arrangement 220). In yet another embodiment of the present invention, as shown in FIG. 1 or in FIG. 4, the pad regions 122 in the adjacent pad units 120 are staggered (arrangement 230).

Figure 5:
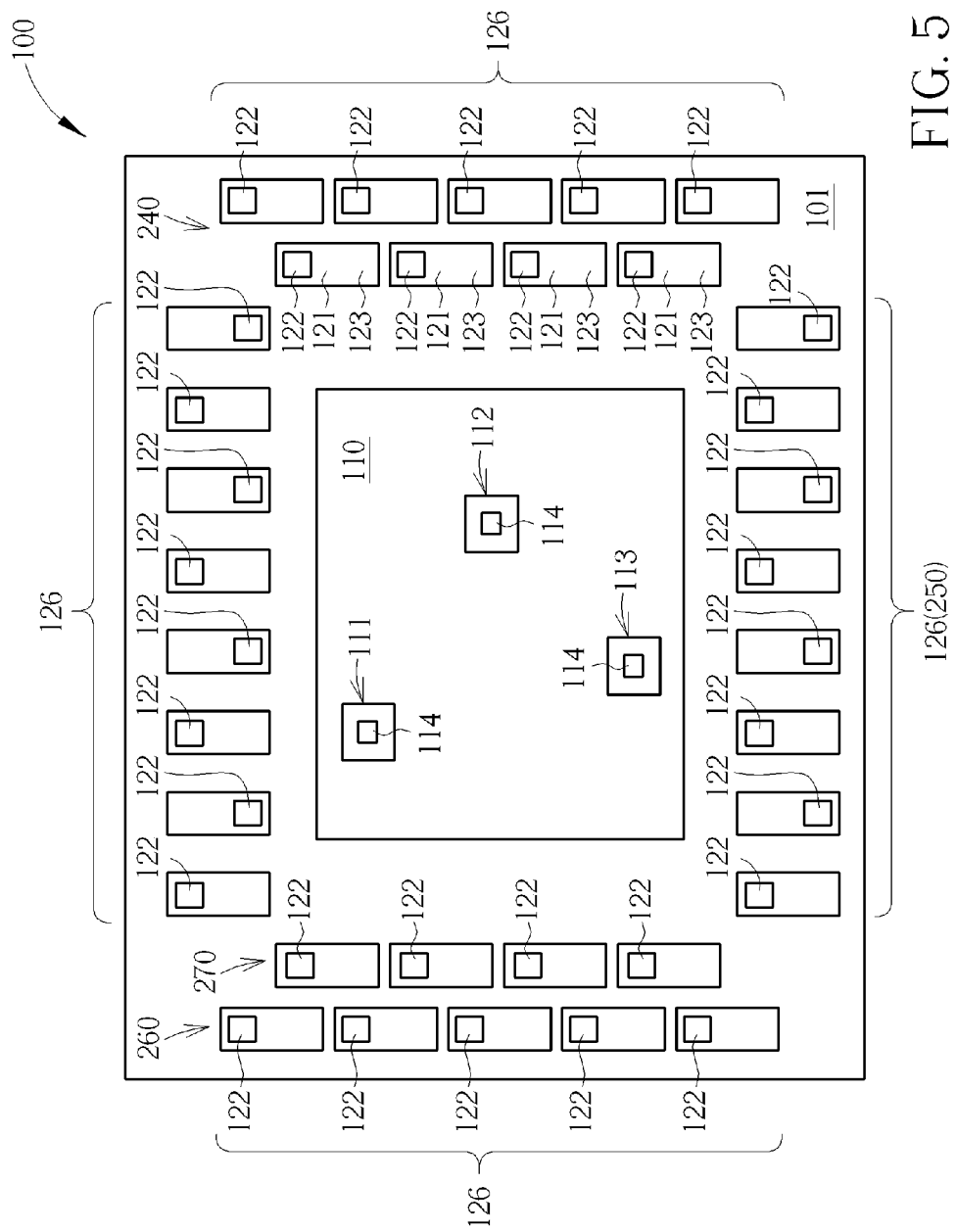
Figure 7:
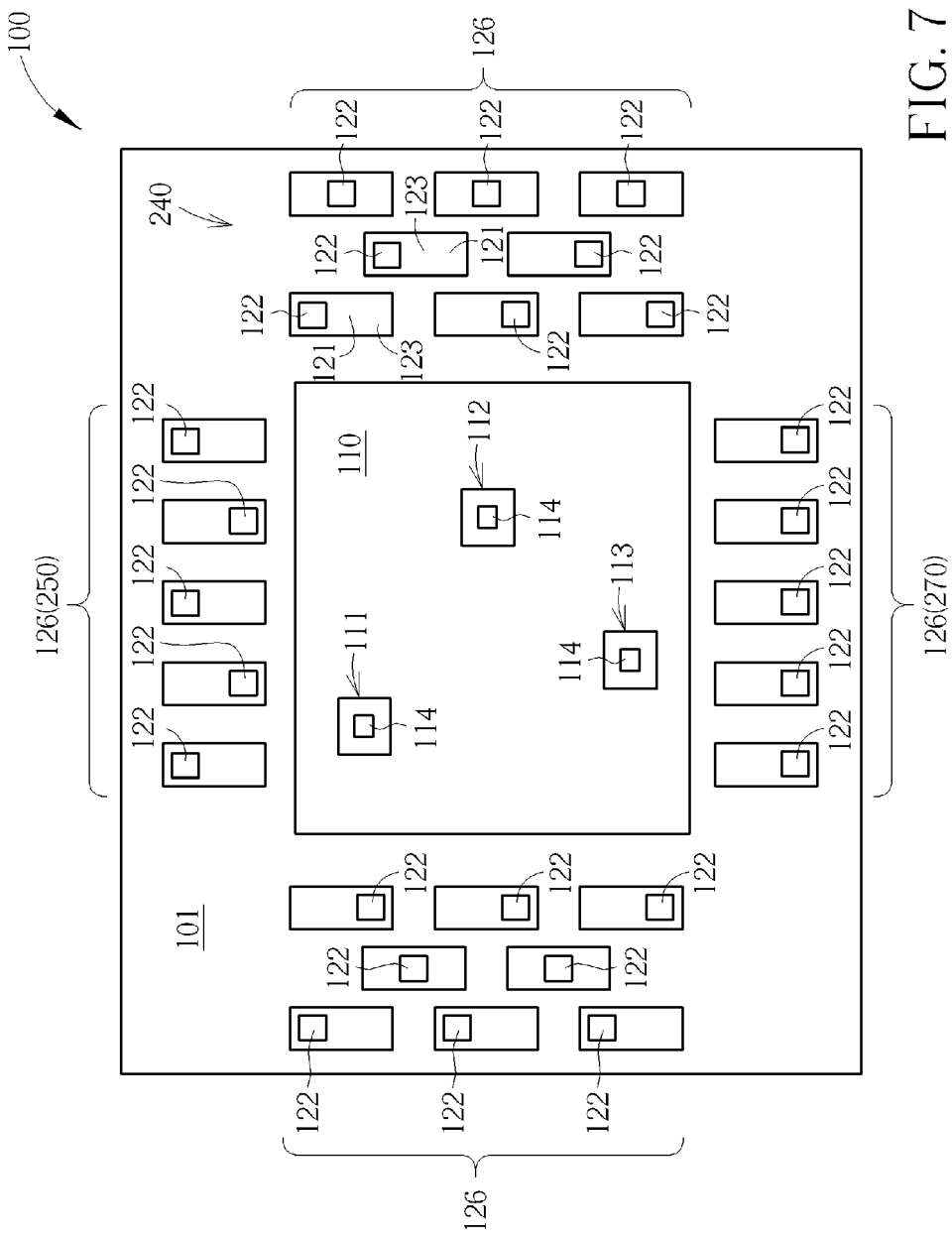

In still another embodiment of the present invention, as shown in FIG. 5 or in FIG. 7, the pad units 120 in two adjacent rows are staggered with respect to each other (arrangement 240).

Or alternatively, in another embodiment of the present invention, as shown in FIG. 4, in FIG. 5, in FIG. 6 or in FIG. 7, the pad regions in the pad units of the same row are staggered (arrangement 250). In another embodiment of the present invention, as shown in FIG. 1 or in FIG. 5, the pad regions 122 in the pad units 120 of the same row have the same order (arrangement 260), for example, all are disposed in the first position, in the second position or in the third position. Further, in another embodiment of the present invention, as shown in FIG. 1, in FIG. 6, or in FIG. 7, the pad units in the same row have the same order (arrangement 270).

Also, in another embodiment of the present invention, as shown in FIG. 6 or in FIG. 7, there may be three or more rows of pad units 120 in a pad unit group 126. Due to the reason to simplify the illustrations, FIG. 6 or FIG. 7 illustrates merely three rows. If there are three or more rows of pad units 120 in a pad unit group 126, the pad regions 122 in the pad units 120 may be sandwiched between the pad regions of the adjacent pads (arrangement 280).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
a core circuit comprising a plurality of core metal oxide semiconductors (core MOS); and
a plurality of pad units, respectively electrically connected to said core circuit, and each pad unit comprising a plurality of pad metal-oxide-semiconductors (pad MOS), wherein the longer dimension of a core gate in each said core MOS and the longer dimension of a pad gate in each said pad MOS all extend in the same direction;
wherein said pad unit further comprises an individual N-type metal oxide semiconductor (NMOS) region, an individual pad region and an individual P-type metal oxide semiconductor (PMOS) region, one of said N-type metal oxide semiconductor (NMOS) region, said pad region and said P-type metal oxide semiconductor (PMOS) region of each said pad unit is sandwiched between the other two of said N-type metal oxide semiconductor (NMOS) region, said pad region and said P-type metal oxide semiconductor (PMOS) region of each said pad unit, and said pad metal-oxide-semiconductors are disposed in said pad region and in at least one of said NMOS region and said PMOS region of said pad unit.

2. The electronic device of claim 1, wherein said pad regions in adjacent said pad units are staggered.

3. The electronic device of claim 1, wherein said pad region in said pad unit is sandwiched between said pad regions in adjacent said the pad units.

4. The electronic device of claim 1, wherein a plurality of pad units disposed in one side of the four sides of said core circuit have at least two rows of said pad units.

5. The electronic device of claim 4, wherein said pad units in two adjacent said rows are staggered.

6. An electronic device, comprising:
a core circuit, comprising a plurality of core metal oxide semiconductors (core MOS); and
a plurality of pad units, respectively electrically connected to said core circuit, and each said pad unit comprising a plurality of pad metal oxide semiconductors (pad MOS), wherein the longer dimension of a core gate in each said core MOS and the longer dimension of a pad gate in each said pad MOS have extension directions which are parallel to each other;
wherein said pad unit further comprises an individual N-type metal oxide semiconductor (NMOS) region, an individual pad region and an individual P-type metal oxide semiconductor (PMOS) region, one of said N-type metal oxide semiconductor (NMOS) region, said pad region and said P-type metal oxide semiconductor (PMOS) region of each said pad unit is sandwiched between the other two of said N-type metal oxide semiconductor (NMOS) region, said pad region and said P-type metal oxide semiconductor (PMOS) region of each said pad unit, and wherein said pad metal-oxide-semiconductors are disposed in said pad region and in at least one of said NMOS region and said PMOS region of said pad unit.

7. The electronic device of claim 6, wherein a plurality of pad units disposed in one side of the four sides of said core circuit have at least two rows of said pad units.

8. The electronic device of claim 7, wherein said pad units in two adjacent said rows are staggered.

9. The electronic device of claim 7, wherein said pad regions in said pad units of a same row are staggered.

* * * * *